United States Patent [19]

Soni et al.

[11] Patent Number: 4,609,845
[45] Date of Patent: Sep. 2, 1986

[54] STRETCHED PIEZOELECTRIC POLYMER COAXIAL CABLE

[75] Inventors: Pravin L. Soni, Union City; Nigel R. Farrar, Mountain View, both of Calif.

[73] Assignee: Raychem Corporation, Menlo Park, Calif.

[21] Appl. No.: 628,358

[22] Filed: Jul. 6, 1984

[51] Int. Cl.⁴ .............................................. H01L 41/08
[52] U.S. Cl. ................................. 310/357; 310/330; 310/800; 310/363; 310/364; 29/25.35
[58] Field of Search ............... 310/311, 328, 330–332, 310/340, 363, 364, 800, 357, 358; 361/260; 174/110 R, 110 F, 110 FC, 110 PM, 110 V, 110 P, 110 AR, 110 SR; 29/25.35

[56] References Cited

U.S. PATENT DOCUMENTS

| | | | |
|---|---|---|---|
| 3,750,127 | 7/1973 | Ayers et al. | 310/330 X |
| 3,798,474 | 3/1974 | Cassand et al. | 310/331 |
| 3,971,250 | 7/1976 | Taylor | 310/331 X |
| 4,303,733 | 12/1981 | Bülle et al. | |
| 4,369,391 | 1/1983 | Micheron | 310/332 X |
| 4,378,721 | 4/1983 | Kaneko et al. | 310/800 X |

FOREIGN PATENT DOCUMENTS 2042256 9/1980 United Kingdom ............... 310/330

*Primary Examiner*—Mark O. Budd
*Attorney, Agent, or Firm*—Edith A. Rice; Herbert G. Burkard

[57] ABSTRACT

A piezoelectric coaxial cable comprises a conductive polymer core comprising a high molecular weight polymeric material having conductive particles dispersed therein, a piezoelectric polymer layer surrounding the conductive polymer core, and an outer conductor surrounding the piezoelectric polymer layer. The high molecular weight polymeric material of the conductive polymer core comprises a polymer capable of being intimately bonded to the piezoelectric polymer.

7 Claims, 1 Drawing Figure

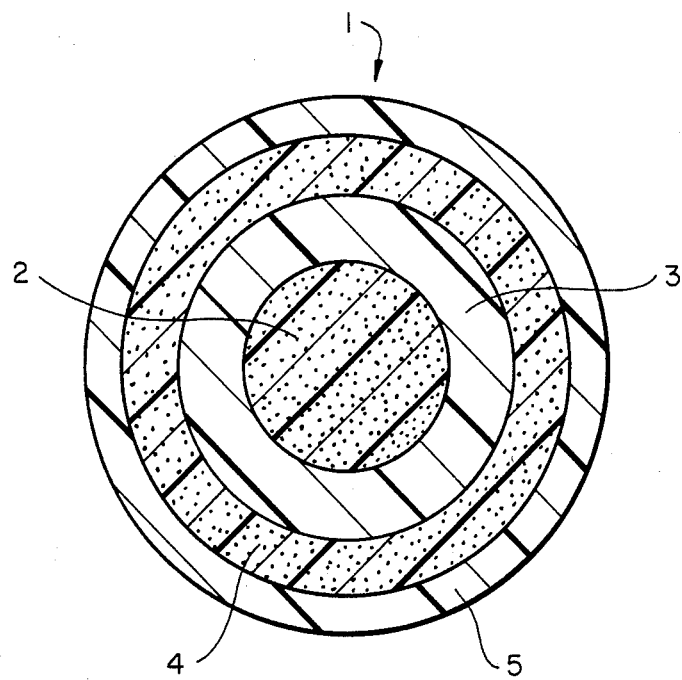
FIG_1

STRETCHED PIEZOELECTRIC POLYMER COAXIAL CABLE

BACKGROUND OF THE INVENTION

This invention relates to a piezoelectric coaxial cable and to a method of preparing the cable.

In general terms, a piezoelectric coaxial cable, comprises a central conductor, an intermediate piezoelectric layer surrounding the central conductor, and an outer conductor surrounding the piezoelectric layer. Such piezoelectric coaxial cables have been proposed for use as transducers since, when they are subjected to an applied pressure, for example caused by the impact of an object, or to acoustic pressure changes, a potential difference will be generated between the conductors by the piezoelectric material. Applications for such devices are numerous and include underwater towed-array hydrophones, intrusion detectors, and the like.

In recent years certain polymeric materials, for example poly(vinylidene fluoride) ($PVF_2$) and vinylidene fluoride copolymers have been suggested for use as piezoelectric materials. In order to maximize the piezoelectric properties of a vinylidene fluoride polymer, it is necessary to orient the polymer by stretching it, preferably up to its "natural" draw ratio of about 4:1 or beyond, in order to convert at least a portion of the polymer from its initial alpha or form II crystalline phase into its beta or form I crystalline phase. Simultaneously with, or subsequent to, the stretching operation, it is necessary to polarize the polymer by applying a high electric field gradient across the polymer in a direction perpendicular to the direction of orientation in order to align the dipoles in the beta phase of the polymer. Electric field gradients of from 5 to 200 MV/m are typical for the polarizing operation, the maximum applied field gradient usually being determined by the dielectric breakdown strength of the polymer material.

In order to maximize the piezoelectric response of a piezoelectric coaxial cable the intermediate piezoelectric layer would need to be stretched axially and polarized radially between a central conductor and an outer conductor. While the outer electrode may be applied to the intermediate layer after stretching, or, if a corona polarizing method is employed, the cable may be passed through a corona discharge electrode and an outer conductor for the cable be subsequently provided, significant problems are encountered in the provision of an inner electrode for the cable. It is not possible to extrude the piezoelectric layer onto a conventional metal conductor, e.g., a copper conductor, in that it would then be impossible subsequently to stretch the intermediate layer in order to convert it into the beta-phase. This problem is particularly acute when attempting to make long lengths of piezoelectric coaxial cable.

One solution which has been proposed is to manufacture a piezoelectric coaxial cable by preparing a tape of the piezoelectric polymer, stretching it, polarizing it, and then wrapping it around the inner conductor. (See, for example, U.S. Pat. No. 3,798,474 to Cassand et al and U.K. Patent Application No. 2,042,256 to Quilliam.) However, this process is disadvantageous in that it requires numerous steps and may result in poor electrical contact between the piezoelectric polymer and the inner conductor.

U.S. Pat. No. 4,303,733 to Bülle discloses filaments which are essentially coaxial cables comprising at least three layers, at least two of which electrically conductive with at least one electrical insulating layer positioned between the two conductive layers. The patent discloses that the intermediate layer may be piezoelectric. It states that where the filament pursuant to the invention is to be provided with piezoelectric characteristics, the core component preferably is compressible, which is achieved either by utilizing hollow filaments or by selection of appropriate synthetic polymers, as for the example, polyolefins with low molecular weight or polyethers. The patent continues to say that a suitable form of execution consists of using as the core component, an electrically conductive, highly viscous liquid with metal and/or carbon black and/or graphite particles dispersed therein. Suitable highly viscous liquids mentioned are, e.g., cis- and transpolyacetylene of relatively low molecular weight.

We have now discovered that an improved piezoelectric coaxial cable results if the core comprises a high molecular weight polymeric material having conductive particles dispersed therein, and the high molecular weight polymer of the core and the piezoelectric polymer are selected such that an intimate bond is formed between the core and the surrounding piezoelectric layer.

SUMMARY OF THE INVENTION

One aspect of this invention comprises a piezoelectric coaxial cable comprising:

(a) a conductive polymer core comprising a high molecular weight polymeric material having conductive particles dispersed therein;

(b) a piezoelectric polymer layer surrounding the conductive polymer core; and (c) an outer conductive layer surrounding said piezoelectric electric layer;

said high molecular weight polymeric material of the core being intimately bonded to the piezoelectric polymer.

Another aspect of this invention provides a method of preparing a piezoelectric coaxial cable which comprises (a) extruding a core of a high molecular weight conductive polymeric material having conductive particles dispersed therein;

(b) extruding a piezoelectric polymer layer around the core thereby forming a composite structure having an intimate bond between the polymer of the core and the piezoelectric polymer;

(c) stretching the resulting composite structure axially such that the length of the structure is increased about four times its original length;

(d) applying an outer conductor onto the surface of the piezoelectric polymer layer; and (e) polarizing the piezoelectric layer to increase the piezoelectric properties thereof.

The piezoelectric polymer layer is preferably a vinylidene fluoride polymer and the high molecular weight polymeric material of the conductive polymer core is preferably the same polymer as the piezoelectric layer, an elastomer, such as ethylene-ethyl acrylate elastomer, or a thermoplastic elastomer, such as a segmented copolyester thermoplastic elastomer.

BRIEF DESCRIPTION OF THE DRAWING

FIG. 1 shows a cross-sectional view of a typical coaxial cable in accordance with this invention.

DETAILED DESCRIPTION OF THE INVENTION

The piezoelectric cable of this invention has a conductive polymer core comprising a high molecular weight polymeric material having conductive particles therein. The polymeric material is selected so that it intimately bonds to the piezoelectric polymer used to make the cable. The term "intimately bonds" is used in the context of this application to mean that the polymeric material and the piezoelectric material of the cable form a bond between them which is maintained during the subsequent stretching and polarizing steps during manufacture of the cable.

The high molecular weight polymeric material should have an average molecular weight above about 50,000, preferably above about 100,000 and most preferably above 150,000. The average molecular weight, Mw, referred to herein is a weight average molecular weight and is calculated by the following formula $$Mw = \frac{n_x M_x^2}{n_x M_x}$$

where n is the number of moles of species x having molecular weight Mx.

Preferably the polymeric materials used for the conductive core is the same polymer as the piezoelectric polymer, e.g. polyvinylidene fluoride, or other piezoelectric polymer as discussed below, an elastomer or a thermoplastic elastomer.

The term elastomer is used herein to refer to a high molecular weight polymeric material exhibiting a characteristic rubber-like elastic deformability under the action of comparatively small stresses, and returning substantially to its original size and shape upon the removal of the applied stress, and which has an elastic modulus in the uncrosslinked state of 30N/mm$^2$ or less, measured at room temperature using the method of ASTM-D638-72.

Elastomers which can be used in the present invention include, for example, acrylic elastomers, acrylonitrile-butadiene copolymers, chloroprene, chlorinated and chlorosulfonated polyethylenes, epichlorohydrin polymers and fluoroelastomers.

Preferred elastomers are acrylic elastomers, such as ethylene/acrylic ester polymers. Examples of such elastomers include:

(a) An ethylene/alkyl acrylate or ethylene-alkyl methacrylate copolymer where the alkyl group has 1–4 carbon atoms; the proportion of the acrylic ester being about 2.4–8.0 moles of ester groups per kilogram of the copolymer.

(b) A terpolymer of ethylene with an alkyl acrylate or methacrylate wherein the alkyl group has 1–4 carbon atoms, and a third copolymerizable monomer, which may be, for example one of the following:
 i. a C$_1$–C$_{12}$ alkyl monoester or diester of a butenedioic acid,
 ii. acrylic acid
 iii. methacrylic acid,
 iv. carbon monoxide,
 v. acrylonitrile,
 vi. a vinyl ester,
 vii. an alkyl acrylate or alkyl methacrylate, the alkyl group having at least five carbon atoms; and
 viii. maleic anhydride.

Typical acrylic elastomers of this type can be a simple copolymer of ethylene with methyl acrylate, ethyl acrylate, propyl acrylate isopropyl acrylate, a butyl acrylate, methyl methacrylate, ethyl methacrylate, propyl methacrylate, isopropyl methacrylate, a butyl methacrylate or vinyl acetate. Such copolymers if not commercially available, can be made by conventional and well know methods.

The terpolymer of ethylene with an acrylic ester and a third monomer may contain as the third monomer an ester of fumaric acid or maleic acid, wherein the alcohol moiety can be, for example, methyl, ethyl, propyl, isopropyl, various isomers of butyl, pentyl, hexyl, heptyl, octyl, nonyl, decyl, undecyl, dodecyl and the like. The third monomer may also be, among others, a vinyl ester such as for example, vinyl acetate or vinyl butyrate.

Excellent results have been obtained using as the elastomer component of the polymer composition a terpolymer of ethylene, methyl acrylate and a cure-site monomer comprising carboxyl groups available from Du Pont under the trade name Vamac (Registered Trade Mark).

Thermoplastic elastomers include, for example, segmented copolyesters, thermoplastic polyurethanes, styrene-butadiene block copolymers, and ionomers. Illustrated thermoplastic elastomers are segmented copolyesters consisting essentially of recurring intralinear long chain ester units and short chain ester units randomly joined head-to-tail through ester linkages. Such copolyesters are derived, for example, from terephthalic acid, tetramethylene ether glycol and 1,4-butadiene.

The high molecular weight polymer is rendered conductive by dispersing therein conductive particles. The conductive particles can be conductive carbon black, particulate or fibrous graphite, metal particles or metal fibers, or combinations thereof. Preferred are carbon black particles. The resistivity of the conductive polymer material should be less than about 15,000 ohm-cm, preferably less than about 3000 ohm-cm and most preferably less than about 100 ohm-cm. It has been found that during the step of stretching the conductive polymer material during manufacture of the cable, the resistivity of the composition tends to rise. This is particularly true if the polymer used is crystalline. Thus, it is preferred to use a non-crystalline polymeric material. Use of an elastomer, such as elastomeric ethylene-acrylate copolymer or terpolymers, provides a conductive polymer composition whose resistivity remains essentially constant through coextrusion and stretching processes. If, however, it is desired to use a crystalline polymer for the conductive core, annealing of the structure can reduce the resistivity toward its value prior to stretching.

A piezoelectric polymer layer surrounds the conductive polymer core. The piezoelectric polymer can be, for example poly(ethylene terephthalate), nylon 5, nylon 7, poly(hydroxy-butyrate), poly(acrylonitrile-co-vinyl acetate), and vinylidene fluoride polymers. The term "vinylidene fluoride polymer" is intended to include poly-vinylidene fluoride), commonly abbreviated to "PVDF" or "PVF$_2$" and those copolymers of vinylidene fluoride which can be rendered piezoelectric by orientation and polarization. Suitable copolymers include copolymers and terpolymers of vinylidene fluoride with vinyl fluoride, trifluoroethylene, tetrafluoroethylene, vinyl chloride, and chlorotrifluoroethylene. Blends of vinylidene fluoride polymers with other polymers, e.g., poly(methyl methacrylate), can be used. Composites made from vinylidene fluoride polymers and filled vinylidene fluoride polymers may also be used. Preferably the piezoelectric member comprises a vinylidene fluoride polymer, more preferably poly(-vinylidene fluoride) and especially it consists substantially solely of poly(vinylidene fluoride).

The term piezoelectric polymer is used in this application to designate the polymer which in the final form of the coaxial cable exhibits piezoelectric activity. The polymer initially utilized in extruding the polymer layer surrounding the conductive polymer core, may exhibit little, if any, piezoelectric characteristics.

The piezoelectric polymer layer in the coaxial cable should be from about 0.1 to about 2 millimeters (mm) thick and preferably from about 0.5 to about 1 mm.

The piezoelectric coaxial cable has an outer conductor which surrounds the piezoelectric layer. The outer conductor can be metallic or a conductive polymer composition.

Optionally an outer insulating jacket may be applied around the outer conductor. The jacket may be made from any material which is a good electrical insulator and which provides the desired degree of mechanical protection. For example, polyethylene, vulcanized rubber, or poly(vinyl chloride) can be used. Poly(vinyl chloride) is particularly preferred.

FIG. 1 illustrates in cross-section a typical coaxial cable, 1, of this invention. In FIG. 1, a conductive polymer core, 2, of an ethylene-methyl acrylate terpolymer having conductive carbon black dispersed therein. A piezoelectric ($PVF_2$) polymer layer, 3, surrounds the core and outer conductive, 4, surrounds the piezoelectric layer. An outer protective jacket, 5, surrounds the outer conductor.

In another aspect of this invention, additional layers of the piezoelectric member, separated from each other by an intervening conductive polymer layer, may be added over the outer conductor, thereby increasing the piezoelectric response. An example of such a construction is a coaxial cable comprising a conductive polymer core, a first piezoelectric polymer layer surrounding the core, a second conductive polymer layer surrounding the first piezoelectric polymer layer, and a second piezoelectric polymer, etc., and finally an outermost conductor which may be either a metal or a conductive polymer.

The conductive polymer core is formed by extruding the conductive polymeric material in the form of an elongate rod of thickness from about 1 to about 5 mm, preferably from about 1.5 to about 3.0 mm. The piezoelectric polymer layer can coextrude with the core or can be extruded over the core after it has been produced. In either event an intimate bond is formed between the core and the piezoelectric layer. The resulting composite is stretched then polarized to provide the desired piezoelectric activity.

Where the piezoelectric polymer is $PVF_2$, it generally must be stretched and then polarized in a strong electric field before significant piezoelectric responsiveness develops. Stretching partially or substantially converts $PVF_2$ from the alpha-phase in which it ordinarily crystallizes from the melt into oriented chains of the more highly polar beta-phase. The stretching temperature is important. The temperature should be high enough so that there is sufficient molecular mobility for individual polymer segments to realign themselves without fracture, but not so high (above about 150° C.) so that entire alpha-phase chains are mobile enough to slide past each other instead of stretching to the beta-phase conformation, thus resulting in little conversion, and is preferably between about 60° to 100° C. The amount of stretching should be about 200 to 400 percent, or higher, for example using an ultrahigh drawing procedure.

If desired, the $PVF_2$ or the $PVF_2$ and the conductive polymer core may be crosslinked, for example by gamma or electron beam irradiation, and stretching at a temperature above its melting point by the method described in application Ser. No. 603,535 filed 4/25/84 of Soni et al., the disclosure of which is incorporated herein by reference.

The outer conductor can be applied directly to the surface of the piezoelectric polymer by, for example, coating it with a conductive paint. Conductive paints comprising a suspension of metal particles, in particular silver particles, dispersed in a liquid vehicle can be employed. The paint can be applied by spraying, brushing, dipping, coating, or the like. Another technique for attaching the outer conductor is to vacuum deposit a layer of highly conductive metal, e.g. silver, onto the surface. Conductive polymer outer conductors can be applied by extrusion or coextrusion.

The poling process (polarization) converts the randomly oriented dipoles of the beta-phase into uniformly oriented ones. Poling may take place during the stretching process or preferably, after stretching has taken place. For poling $PVF_2$, electric fields of 5 to 200 MV/m can be used, but fields of 50 to 150 MV/m are preferred, and about 100 MV/m most prefered. The poling may be done by a contact method, in which case the outer electrode should be provided before the poling. A high voltage connection is made directly to the outer electrode while the inner electrode is connected to the ground, or vice versa. The device is heated to a temperature above the alpha-transition temperature in order to maximize molecular mobility and poled at temperature for about 0.5 to 2.5 hours, and preferably 1 hour. A poling temperature in the range from about 60° to 120° C. is preferred and about 80° C. most preferred. At the end of this period, the device is cooled while maintaining the voltage in order to freeze in the dipole orientation.

$PVF_2$ can also be poled by a corona discharge, in which case the outer electrode must be provided after the poling. The device is passed through a tubular corona discharge electrode with the inner conductor of the device grounded. Preferred poling times are from a few minutes to half an hour. While corona poling may be performed at temperatures other than room temperature, it is often done at room temperature because temperature control is sometimes inconvenient.

EXAMPLE

This example illustrates the preparation of a typical coaxial cable of this invention.

A conductive polymer formulation with a resistivity of 12 ohm-cm was prepared by milling an acrylic elastomer (Vamac B-124, DuPont) with 16.0 weight per cent carbon black (Black Pearls 2000, Cabot). It was then extruded using an extruder equipped with a 2.5 mm ID die and operating at a 12 rpm screw speed, 3500–4000 psi head pressure and a 68° C. (zone 1) to 145° C. (die) temperature profile.

Poly(vinylidene fluoride) (Solef 1010, Solvay) was then extruded over the rod using the same extruder but operating at 10–20 rpm screw speed, 800 psi pressure and 210° C. (zone 1) to 227° C. (die) temperature profile.

A segment of this conductive rod surrounded by PVF$_2$ was stretched at 80° C. on an Instron mechanical tester equipped with a hot box at a rate of 2 in./min. to approximately the natural draw ratio, i.e. about 300%. The stretched composite structure was coated with conductive silver paint and then poled at about 80° C. for 1 hour. The applied voltage was about 35 kV.

The hydrostatic coefficient was measured using a typical method for such measurement as outlined below.

The hydrostatic coefficient was determined to be about 10 pC/N.

The coefficient was measured by placing the sample in a cyclical pressure cell, with the cyclical hydrostatic pressure being applied by a piston displacing a dielectric oil. Typical peak-to-peak pressures used during an experiment are approximately 140–1000 kPA (20–140 psi) with a frequency of 3 to 10 Hz. The pressure is measured via a Sensotec A205 transducer and 540D amplifier (accuracy approximately 9 kPa). Signals from both devices were fed into a Nicolet 2090 III digital oscilloscope from which peak-to-peak pressures P and charge Q were determined. The hydrostatic coefficient d3h was then determined as $$d3h = Q/AP$$

where A is the sample surface area. For a coaxial cable, A is given by $$A = 2 \, lt/\ln(R/R')$$

where l is the length, t is the thickness, R is the outer radius, and R' is the inner radius. A common unit for d3h is pC/N (picoCoulombs/Newton). The pyroelectric effect product in such an experiment is not corrected for, as it amounts to only about 5% of the measured activities. Such a correction, if made, would result in an increase of the reported d3h.

While the invention has been described herein in accordance with certain preferred embodiments thereof, many modifications and changes will be apparent to those skilled in the art. Accordingly, it is intended by the appended claims to cover all such modifications and changes as fall within the true spirit and scope of the invention.

We claim:

1. A method of preparing a piezoelectric coaxial cable which comprises
    (a) extruding a core of a high molecular weight conductive polymer material having conductive particles dispersed therein; and
    (b) extruding a piezoelectric polymer layer around the core thereby forming a composite structure having an intimate bond between the polymer of the core and the piezoelectric poly-polymer;
    (c) stretching the resulting composite structure axially such that the length of the structure is increased at least about three times its original length;
    (d) applying an outer conductor onto the surface of the piezoelectric polymer layer; and
    (e) polarizing the piezoelectric layer to increase the piezoelectric properties thereof.

2. A method in accordance with claim 1 wherein the core and piezoelectric polymer layer are coextruded.

3. A method in accordance with claim 1 wherein the composite structure is stretched at a temperature between about 60° to 100° C.

4. A method in accordance with claim 1 wherein the composite structure is stretched prior to the step of polarization.

5. A method in accordance with claim 1 wherein the composite structure is stretched simultaneously with the step of polarization.

6. A method in accordance with claim 1 wherein the outer conductor is applied prior to the step of polarization.

7. A method in accordance with claim 1 wherein the outer conductor is applied after the step of polarization.

* * * * *

UNITED STATES PATENT AND TRADEMARK OFFICE
CERTIFICATE OF CORRECTION

PATENT NO. : 4,609,845

DATED : September 2, 1986

INVENTOR(S) : Soni, Farrar

It is certified that error appears in the above-identified patent and that said Letters Patent is hereby corrected as shown below:

Col. 7, line 33, please delete "$A=2\ lt/ln(R/R')$" and insert in lieu thereof -- $A=2\pi\ lt/ln(R/R')$ --.

Signed and Sealed this

Twelfth Day of April, 1988

Attest:

DONALD J. QUIGG

*Attesting Officer*          Commissioner of Patents and Trademarks